(12) United States Patent
Schulze et al.

(10) Patent No.: US 11,282,926 B2
(45) Date of Patent: Mar. 22, 2022

(54) SEMICONDUCTOR DEVICE WITH A SEMICONDUCTOR BODY OF SILICON CARBIDE

(71) Applicant: Infineon Technologies AG, Neubiberg (DE)

(72) Inventors: Hans-Joachim Schulze, Taufkirchen (DE); Wolfgang Bergner, Klagenfurt (AT); Andre Rainer Stegner, Unterhaching (DE)

(73) Assignee: Infineon Technologies AG, Neubiberg (DE)

( * ) Notice: Subject to any disclaimer, the term of this patent is extended or adjusted under 35 U.S.C. 154(b) by 2 days.

(21) Appl. No.: 16/814,174

(22) Filed: Mar. 10, 2020

(65) Prior Publication Data

US 2020/0295142 A1    Sep. 17, 2020

(30) Foreign Application Priority Data

Mar. 11, 2019 (DE) .......................... 102019106087.7

(51) Int. Cl.
*H01L 21/46*     (2006.01)
*H01L 29/16*     (2006.01)
(Continued)

(52) U.S. Cl.
CPC ...... *H01L 29/1608* (2013.01); *H01L 29/1095* (2013.01); *H01L 29/4236* (2013.01);
(Continued)

(58) Field of Classification Search
CPC ..... H01L 29/10; H01L 29/1095; H01L 29/16; H01L 29/1608; H01L 29/41;
(Continued)

(56) References Cited

U.S. PATENT DOCUMENTS

2019/0259841 A1*   8/2019   Stegner ................. H01L 21/046

FOREIGN PATENT DOCUMENTS

DE    102018103550 A1    8/2019

OTHER PUBLICATIONS

Maximenko, S., et al., "Study of Forward Voltage Drift in Diffused SiC PiN Diodes Doped by Al or B", Materials Science Forum, vols. 483-485, 2005, pp. 989-992.

\* cited by examiner

*Primary Examiner* — Fazli Erdem
(74) *Attorney, Agent, or Firm* — Murphy, Bilak & Homiller, PLLC

(57) ABSTRACT

A semiconductor device includes a SiC body having a first semiconductor area of a first conductivity type and a second semiconductor area of a second conductivity type. The first semiconductor area is electrically contacted with a first surface of the SiC body and forms a pn junction with the second semiconductor area. The first and second semiconductor areas are arranged on one another in a vertical direction perpendicular to the first surface. The first semiconductor area has first and second dopant species. An average dopant concentration of the first dopant species in a first part of the first semiconductor area adjoining the first surface is greater than an average dopant concentration of the second dopant species. An average dopant concentration of the second dopant species in a second part of the first semiconductor area adjoining the second semiconductor area is greater than a dopant concentration of the first dopant species.

22 Claims, 6 Drawing Sheets

(51) Int. Cl.
*H01L 29/10* (2006.01)
*H01L 29/423* (2006.01)
*H01L 29/66* (2006.01)
*H01L 29/78* (2006.01)

(52) U.S. Cl.
CPC .. *H01L 29/66068* (2013.01); *H01L 29/66712* (2013.01); *H01L 29/7813* (2013.01)

(58) Field of Classification Search
CPC ............... H01L 29/41766; H01L 29/42; H01L 29/4236; H01L 29/66; H01L 29/66068; H01L 29/66712; H01L 29/67; H01L 29/78; H01L 29/7802; H01L 29/7813; H01L 29/861; H01L 21/046
USPC .......................................................... 257/77
See application file for complete search history.

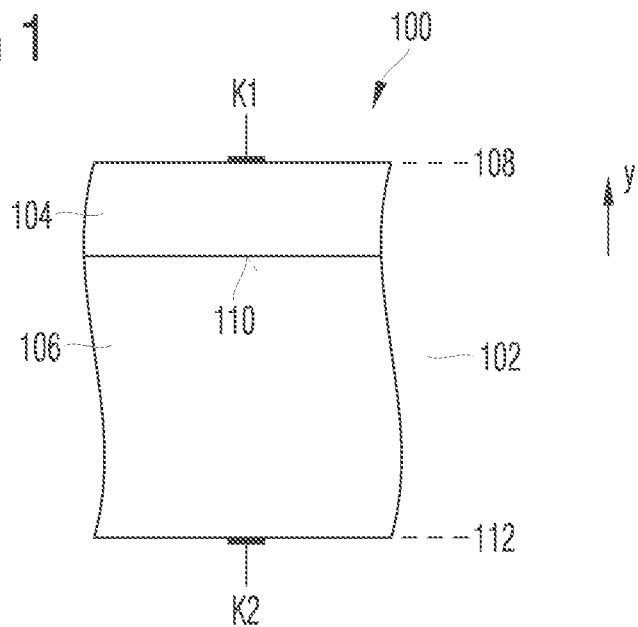
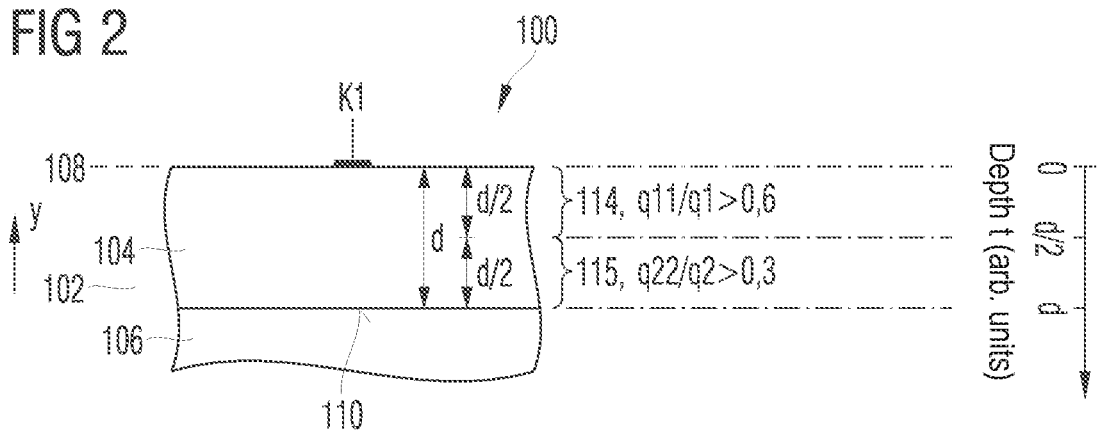
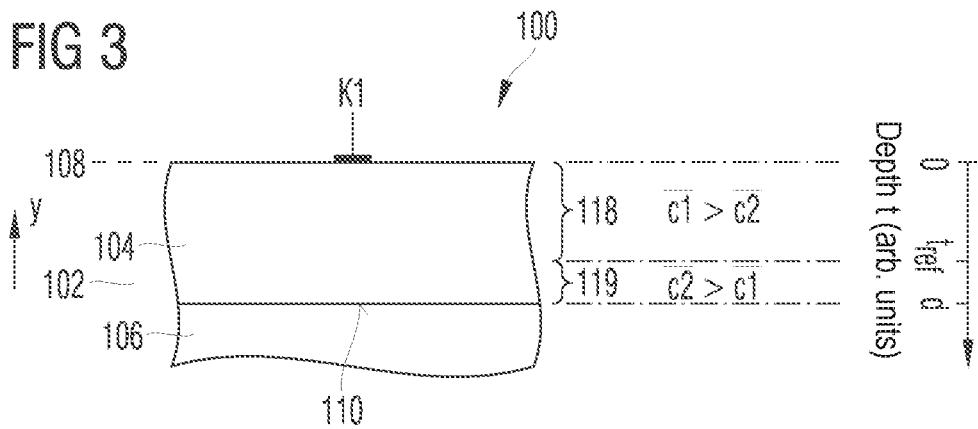

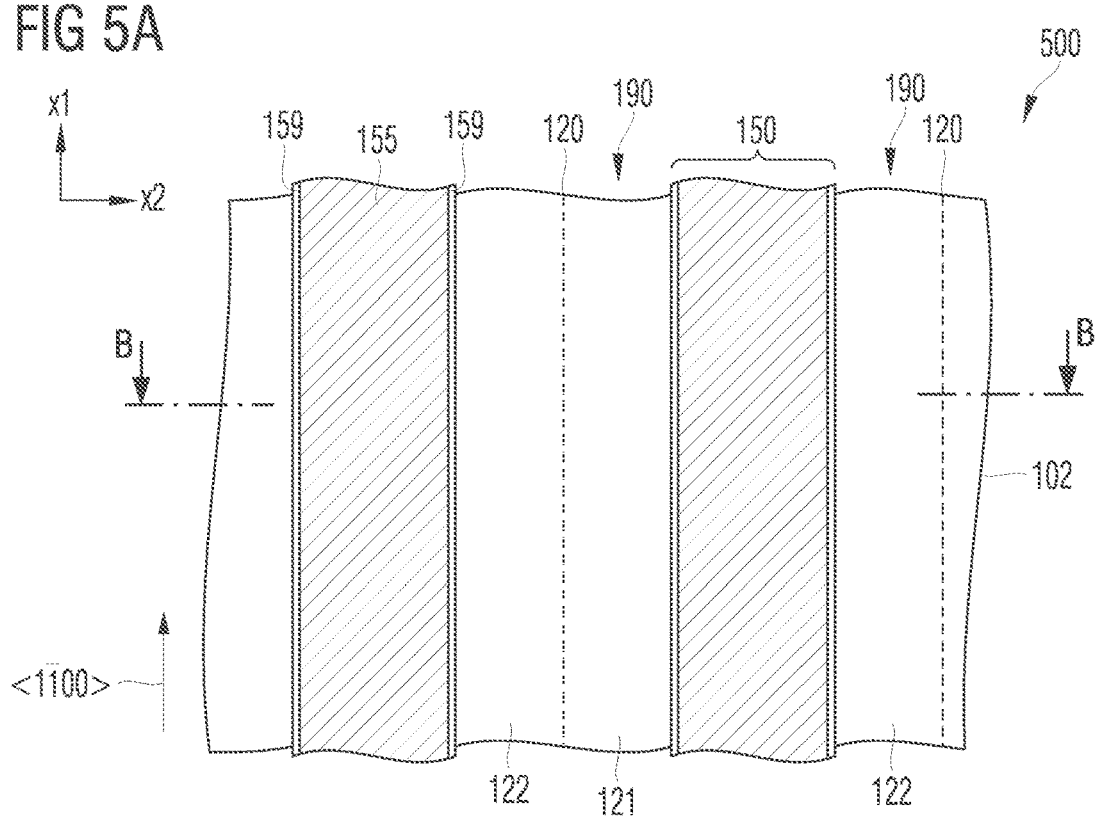
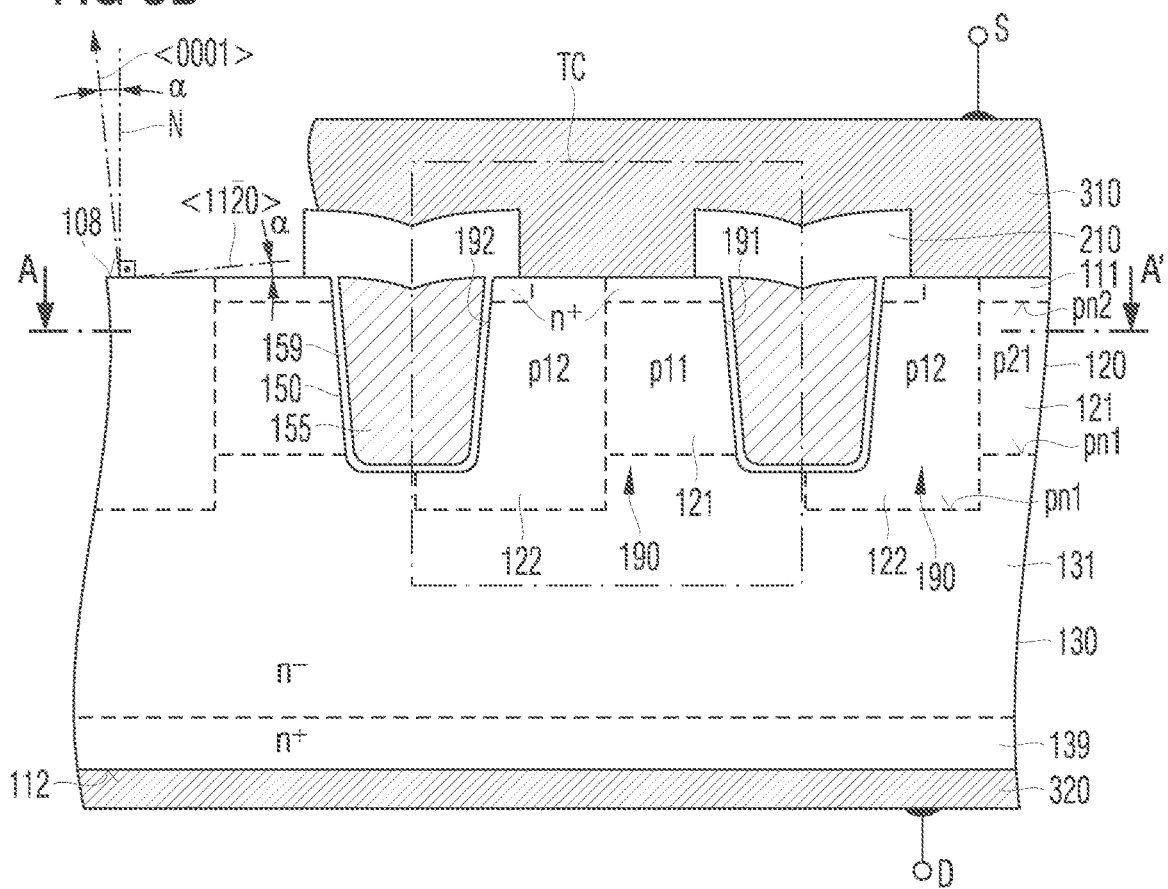

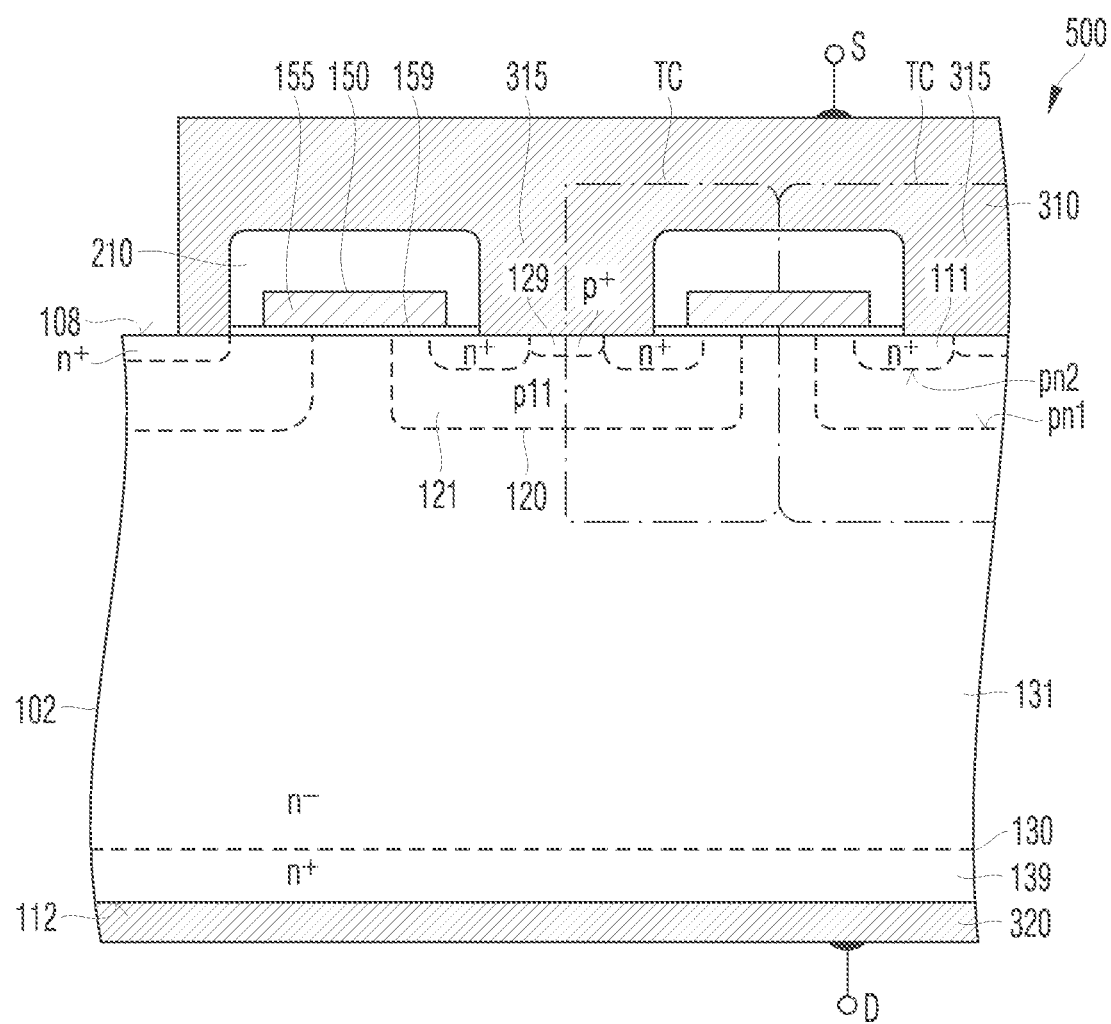

SEMICONDUCTOR DEVICE WITH A SEMICONDUCTOR BODY OF SILICON CARBIDE

TECHNICAL FIELD

The disclosure relates to semiconductor devices made from silicon carbide (SiC).

BACKGROUND

Demands with regard to reliability during the specified operating lifetime are made on SiC semiconductor devices, for example SiC power semiconductor field-effect transistors or SiC power semiconductor diodes. The reliability of the SiC semiconductor device can be impaired by a variety of different mechanisms both in operation and as a result of the manufacture of the semiconductor device.

This disclosure is dedicated to the improvement of the reliability of SiC semiconductor devices.

SUMMARY

This disclosure relates to a semiconductor device having an SiC semiconductor body. The SiC semiconductor body has a first semiconductor area of a first conductivity type and a second semiconductor area of a second conductivity type. The first semiconductor area is electrically contacted with a first surface of the SiC semiconductor body and forms a pn junction with the second semiconductor area. The first semiconductor area and the second semiconductor area are arranged one on top of another in a vertical direction perpendicular to the first surface. The first semiconductor area has a first dopant species and a second dopant species. An average dopant concentration of the first dopant species in a first part of the first semiconductor area adjoining the first surface of the SiC semiconductor body is greater than an average dopant concentration of the second dopant species in the first part. An average dopant concentration of the second dopant species in a second part of the first semiconductor area adjoining the second semiconductor area is greater than a dopant concentration of the first dopant species in the second part. The average dopant concentrations are determined along a vertical extent of the first and second parts.

This disclosure additionally relates to a process for producing a semiconductor device. The process comprises providing an SiC semiconductor body. The process further comprises forming a first semiconductor area of a first conductivity type and a second semiconductor area of a second conductivity type in the SiC semiconductor body. The first semiconductor area is electrically contacted with a first surface of the SiC semiconductor body and forms a pn junction with the second semiconductor area. The first semiconductor area and the second semiconductor area are arranged one top of another in a vertical direction perpendicular to the first surface. The first semiconductor area has a first dopant species and a second dopant species. An average dopant concentration of the first dopant species in a first part of the first semiconductor area adjoining the first surface of the SiC semiconductor body is greater than an average dopant concentration of the second dopant species in the first part. An average dopant concentration of the second dopant species in a second part of the first semiconductor area adjoining the second semiconductor area is greater than an average dopant concentration of the first dopant species in the second part. The average dopant concentrations are determined along a vertical extent of the first and second parts.

Those skilled in the art will recognize additional features and advantages upon reading the following detailed description, and upon viewing the accompanying drawings.

BRIEF DESCRIPTION OF THE DRAWINGS

The accompanying drawings serve for understanding of working examples, are incorporated into the disclosure and form part thereof. The drawings illustrate merely working examples and, together with the description, serve for elucidation thereof. Further working examples and numerous advantages of those envisaged will be immediately apparent from the detailed description that follows. The elements and structures shown in the drawings are not necessarily shown to scale with one another. Identical reference numerals refer to identical or corresponding elements and structures.

FIGS. 1 to 3 are schematic cross-sectional views of an SiC semiconductor body of a semiconductor device according to working examples.

FIG. 5A is a schematic horizontal cross section through a section of a semiconductor device according to one embodiment with transistor cells in stripe form with deep trench gate electrodes and a transistor channel on one side.

FIG. 5B is a schematic vertical cross section through the section of the semiconductor device according to FIG. 5A along the cross-section line B-B.

FIG. 6 is a schematic vertical cross section through a section of a semiconductor device in one embodiment with planar gate structures.

DETAILED DESCRIPTION

Figure 4A:
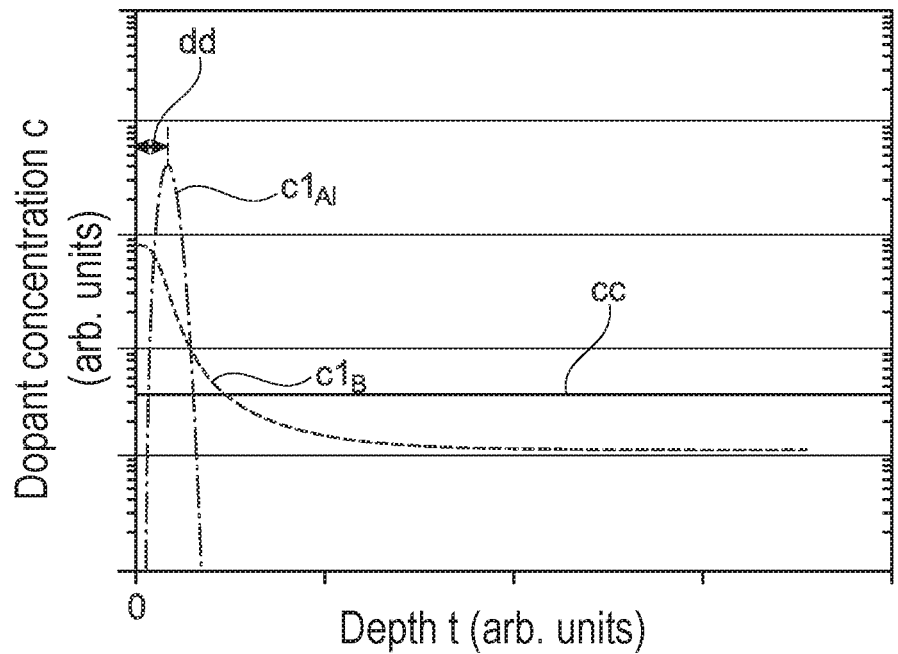
FIGS. 4A to 4B are schematic diagrams for illustration of superposed concentration profiles in a first semiconductor area.

The detailed description that follows refers to the accompanying drawings that form part of the disclosure and in which specific working examples are shown for illustrative purposes. In this connection, direction terminology such as "top side", "bottom", "front side", "reverse side", "back", "front" etc. are based on the alignment of the figures just described. Since the components of the working examples can be positioned in different orientations, the direction terminology serves merely for elucidation and should not be regarded as limiting in any way.

It will be apparent that further working examples exist and that structural or logical alterations may be made to the working examples without departing from what has been defined by the claims. The description of the working examples is not limiting in that respect. More particularly, elements of working examples described hereinafter may be combined with elements of other working examples described, unless the opposite is apparent from the context.

The terms "have", "contain", "comprise", "include" and the like hereinafter are indeterminate terms that on the one hand refer to the presence of said elements or features, and on the other hand do not rule out the presence of further elements or features. Indefinite articles and definite articles include both the plural and the singular, unless the opposite is clearly apparent from the context.

If a range of values with the specification of one limit or two limits is defined for a physical parameter, the expressions "from" and "to" or "less than" and "more than" include the respective limit. A statement of the "from . . . to" type is accordingly understood to mean "from at least . . . to at most". A statement of the "less than . . . " ("more than . . . ") type is correspondingly understood to mean "at most . . . " ("at least . . . ").

In one working example, a semiconductor device has an SiC semiconductor body. The SiC semiconductor body has a first semiconductor area of a first conductivity type and a second semiconductor area of a second conductivity type. The first semiconductor area is electrically contacted with a first surface of the SiC semiconductor body and forms a pn junction with the second semiconductor area. The first semiconductor area and the second semiconductor area are arranged one on top of another in a vertical direction perpendicular to the first surface. The first semiconductor area has a first dopant species and a second dopant species. An average dopant concentration of the first dopant species in a first part of the first semiconductor area adjoining the first surface of the SiC semiconductor body is greater than an average dopant concentration of the second dopant species in the first part. An average dopant concentration of the second dopant species in a second part of the first semiconductor area adjoining the second semiconductor area is greater than a dopant concentration of the first dopant species in the second part. The average dopant concentrations are determined along a vertical extent of the first and second parts.

For example, the SiC semiconductor body may be formed from monocrystalline silicon carbide (SiC), for example 2H-SiC (SiC of the 2H polytype), 6H-SiC or 15R-SiC. In one working example, the material of the SiC semiconductor body is 4H-SiC. What is meant here and hereinafter by a component being "composed of" a material or being "formed from" a material may be that said component consists of the material within the scope of manufacturing tolerances and with the exception of dopants.

The first surface may form the front side of the SiC semiconductor body and be planar or corrugated. A corrugated first surface may be caused by tilting of a main lattice plane of the SiC semiconductor body to a growth direction. A normal to a flat section of the first surface or to a middle plane of a corrugated first surface defines the vertical direction. The vertical direction may run parallel to the growth direction. In the case of a corrugated first surface, this may comprise coplanar surface sections that each run obliquely, i.e. in an inclined manner, to the vertical direction. Directions perpendicular to the vertical direction or, in other words, parallel to a flat section of the first surface or parallel to the middle plane of a corrugated first surface are lateral (horizontal) directions.

In one working example, the first conductivity type is p-type and the second conductivity type is n-type. In another working example, the first conductivity type is n-type and the second conductivity type is p-type.

The working examples described herein enable optimization of the semiconductor device with regard to different functions of the first semiconductor area. For example, the first part of the first semiconductor area may be optimized with regard to the properties of an electrical contact resistance with a contact structure on the first surface, for example with regard to scatter, i.e. lateral homogeneity over the semiconductor wafer and reproducibility from wafer to wafer and from lot to lot, and resistance value, and the second part of the first semiconductor area may be optimized, for instance, with regard to another property, for instance injection efficiency. In view of the comparatively minor diffusion of the dopants into SiC compared to other semiconductor materials, for instance silicon, the subdivision of the first semiconductor area into functional units may be undertaken. It is thus possible, for example, to optimize the reliability of the semiconductor device without simultaneously impairing other component parameters, for instance injection efficiency.

In one working example, a flattest dopant energy level of the first dopant species has a greater energy gap from the closest band edge than a flattest dopant energy level of the second dopant species from the closest band edge. The comparatively lower energy level of the first dopant species may contribute, for example, to an improvement in the electrical contact resistance in the first part of the first semiconductor area. In one working example, a lowest dopant energy level of the first dopant species may have a greater energy gap from the closest band edge than a lowest dopant energy level of the second dopant species from the closest band edge.

In one working example of the semiconductor device, the first dopant species is B. Alternatively or additionally, the second dopant species may be Al and/or Ga. In view of the comparatively more significant diffusion of boron into SiC compared to other p-type dopants, there is comparatively more rapid vertical spread of the boron profile through subsequent processes, and hence the effect of a more inhomogeneous transformation of SiC through subsequent processes, for example etching, silicide formation, hydrogen treatment or else sacrificial oxide formation, can be reduced. This can enable, for example, an improvement in the reliability and/or reproducibility and/or homogeneity of the electrical contacting of the first semiconductor area at the first surface.

In one working example of the semiconductor device, a vertical profile of a dopant concentration of the second dopant species in the second part of the first semiconductor area has at least one peak. The peak in the dopant concentration is a local or global maximum in the vertical profile of the dopant concentration of the second dopant species and can be generated, for example, by means of ion implantation. Proceeding from the peak, the dopant concentration declines at least over a region of the profile in the direction toward the first surface and in the direction of a second surface opposite the first surface. By means of the at least one peak, the semiconductor device can be optimized, for example, with regard to injection efficiency.

In one working example of the semiconductor device, a vertical profile of a dopant concentration of the second dopant species in the second part of the first semiconductor area has a multitude of peaks. A dopant concentration at the multitude of peaks decreases with increasing distance from the first surface of the SiC semiconductor body. In this way, it is possible, for example, to undertake exact adjustment of the injection efficiency.

In one working example, a vertical distance between the first surface and a closest peak of the at least one peak is within a range from 30 nm to 600 nm or within a range from 50 nm to 500 nm or within a range from 100 nm to 400 nm. By establishing a vertical distance of the peaks from the first surface, it is possible, for example, to counteract a reduction in the originally introduced dose of the second dopant species which is caused by subsequent processes at the first surface.

In one working example of the semiconductor device, a maximum dopant concentration of the first dopant species in the first part of the first semiconductor area is less than a maximum dopant concentration of the second dopant species in the second part of the first semiconductor area, for example if the vertical diffusion of the first dopant species in the direction of the opposite wafer side from the wafer surface into which this species is implanted is to be limited in the high-temperature processes that follow the implantation of this dopant species.

In one working example of the semiconductor device, a vertical profile of a dopant concentration of the first dopant species reaches deeper into the SiC semiconductor body than a vertical profile of a dopant concentration of the second dopant species, in order to minimize elevated recombination of free charge carriers caused by the second dopant species (called bipolar degradation). Bipolar degradation here means the spread of extended stacking defects caused by the recombination of free charge carriers, which can lead to degradation of the transmission properties of the components. The dopant profile of the first dopant species may, for example, reach into the second part of the first semiconductor area and even also into the second semiconductor area, in which latter case the dopant concentration of the first dopant species over at least 50% of the vertical extent of this second semiconductor area is below 80% or better below 50% or even better below 30% of the donor concentration present in the second semiconductor area. The statements of direction "deeper" or "depth" should be considered in relation to the first surface here and hereinafter.

In one working example of the semiconductor device, a vertical profile of a dopant concentration of the second dopant species has a separation from the first surface of the SiC semiconductor body. By adjusting the separation from the first surface, it is possible, for example, to counteract a reduction in the originally introduced dose of the second dopant species which is caused by subsequent processes at the first surface.

In one working example, the first semiconductor area has a third dopant species of the first conductivity type. The third dopant species differs from the second dopant species. For example, the second dopant species is Al and the third dopant species is Ga or vice versa. If multiple peaks are formed in the vertical dopant concentration profile in the second part of the first semiconductor area, the multiple peaks may be attributable to an individual dopant species or else to a combination of dopant species. For example, one or more peaks may be formed by an Al dopant concentration profile, and one or more other peaks may be formed by a Ga dopant concentration profile.

In one working example of the semiconductor device, the first part merges into the second part at a depth t proceeding from the first surface. The depth t is within a range between 10% and 85% or between 30% and 85% or between 50% and 80% of a vertical penetration depth d of the first semiconductor area into the SiC semiconductor body.

In one working example of the semiconductor device, the second semiconductor area is a drift zone. The drift zone may be electrically contacted, for example, with a second surface opposite the first surface.

In one working example of the semiconductor device, the drift zone has a first region and a second region having lower doping compared to the first region, and the first region of the drift zone is disposed between the first semiconductor area and the second region of the drift zone. The first region may, for example, be a current spreading zone that distributes a load current emerging from the channel more homogeneously over the active component area.

Optionally, the second semiconductor region may also have at least one of the first to third dopant species.

In one working example, the semiconductor device has a first load terminal at the first surface of the SiC semiconductor body and a second load terminal at the second surface of the SiC semiconductor body. The semiconductor device is set up, for example by means of appropriate dimensions of the chip area that conducts the load current, to conduct a load current of at least 1 A.

In one working example, the semiconductor device may, for example, be an IGFET (insulated gate field effect transistor), for example a MOSFET (metal oxide semiconductor FET) such as a power MOSFET, where the abbreviation MOSFET includes not only FETs with a metallic gate electrode but also FETs with gate electrodes made from a semiconductor material. In one working example, the first semiconductor area corresponds to a body area adjoining a gate dielectric. In another working example, the first semiconductor area reaches deeper into the SiC semiconductor body than a body area adjoining a gate dielectric. For example, the gate dielectric of the IGFET is formed in a gate trench, and the body area adjoins a first side wall of the gate trench. The first side wall is opposite a second side wall of the gate trench, and the first semiconductor area adjoins the second side wall of the gate trench. In this working example, the first semiconductor area may serve, for instance, as shielding area that ensures protection of a base in the gate trench (called trench base) in the event of high field strengths in the barrier state.

It is likewise possible for the semiconductor device also to take the form of an MCD (MOS-controlled diode) or of a pn diode such as an SiC power semiconductor diode. In this case, the first semiconductor area may be an anode area. It is likewise possible for the semiconductor device to be an IGBT (insulated gate bipolar transistor) or else a JFET (junction field effect transistor). As well as the component types mentioned by way of example, it is of course also possible to form other bipolar component types or else unipolar component types with an integrated pn freewheeling diode as semiconductor device according to the teaching described herein.

The pn junction formed between the first semiconductor area and the second semiconductor area is, for example, one by means of which charge carriers are injected into the second semiconductor area in particular modes of operation of the semiconductor device, for example in forward operation of a diode or in forward operation of an inverse diode, for example of a body drain diode of an FET, and these charge carriers are then able to recombine in the second semiconductor area. It is thus possible for the first semiconductor area, in a semiconductor device configured as a diode, to take the form, for example, of an anode area (cathode area) on the first surface of the SiC semiconductor body. In this case, the second semiconductor area may be configured as drift zone and cathode area (anode area). The first semiconductor area may likewise take the form of a body area or else of a further injection-capable semiconductor area of the conductivity type of the body, for example of an electrical shielding area for a dielectric at a trench base of an FET or IGBT. In this case, the second semiconductor area may be configured as drift zone and/or else current distribution zone (current spreading zone).

One working example relates to a process for producing a semiconductor device. The process comprises providing an SiC semiconductor body and forming a first semiconductor area of a first conductivity type and a second semiconductor area of a second conductivity type in the SiC semiconductor body. The first semiconductor area is electrically contacted with a first surface of the SiC semiconductor body and forms a pn junction with the second semiconductor area. The first semiconductor area and the second semiconductor area are arranged one on top of another in a vertical direction perpendicular to the first surface. The first semiconductor area has a first dopant species and a second dopant species. An average dopant concentration of the first dopant species in a first part of the first semiconductor area adjoining the first surface of the SiC semiconductor body is greater than an average dopant concentration of the second dopant species in the first part. An average dopant concentration of the second dopant species in a second part of the first semiconductor area adjoining the second semiconductor area is greater than an average dopant concentration of the first dopant species in the second part, where the average dopant concentrations are determined along a vertical extent of the first and second parts.

In one working example of the process, the forming of the first semiconductor area comprises ion implantation of boron within a dose range from $1\times10^{13}$ cm$^{-2}$ to $1\times10^{15}$ cm$^{-2}$ or within a dose range from $2\times10^{13}$ cm$^{-2}$ to $5\times10^{14}$ cm$^{-2}$. The dose range enables, for example, suitable adjustment of the electrical contact resistance with a contact structure formed at the first surface.

In one working example of the process, the forming of the first semiconductor area comprises at least one ion implantation of Al. The ion implantation of Al serves, for example, to define the dopant concentration profile in the second part of the first semiconductor area, in order thus to adjust, for example, the injection efficiency (emitter efficiency).

In one working example of the process, the forming of the first semiconductor area comprises multiple ion implantations of Al at different ion implantation energies.

The schematic cross-sectional view of FIG. 1 shows a working example of a semiconductor device 100. The semiconductor device 100 has an SiC semiconductor body 102. The SiC semiconductor body 102 has a first semiconductor area 104 of a first conductivity type and a second semiconductor area 106 of a second conductivity type. The first semiconductor area 104 may be a first semiconductor area as described above. The second semiconductor area 106 may likewise be a second semiconductor area as described above.

The first semiconductor area 104 is electrically contacted with a first surface 108 of the SiC semiconductor body 100. The electrical contact is shown in simplified form as first contact K1. The first contact K1 is, for example, a conductive structure that may comprise conductive components electrically connected to one another, for instance contact plugs, metallization tracks and terminal pads. The electrically conductive components in turn consist of conductive material, for instance a metal, a metal silicide, a metal alloy, a highly doped semiconductor or a combination thereof. These electrically conductive components are, for example, parts of a metallization and wiring region of the semiconductor device 100 which is formed by means of the first surface 108. The first contact K1 may be an emitter contact in the case of a semiconductor device 100 in the form of an IGBT. In the case of a semiconductor device 100 in the form of an FET or JFET, the first contact K1 may be a source contact. In the case of a semiconductor device 100 in the form of a diode or thyristor, the first contact K1 may be an anode contact (cathode contact).

The first semiconductor area 104 forms a pn junction 110 with the second semiconductor area 106. The first semiconductor area 104 and the second semiconductor area 106 are arranged one on top of another in a vertical direction y perpendicular to the first surface 108.

The second semiconductor area 106 is electrically contacted with a second surface 112 of the SiC semiconductor body 100 opposite the first surface 108. The electrical contact is shown in simplified form as second contact K2. In respect of the second contact K2, the details given above in association with the first contact K1 apply mutatis mutandis. The second contact K2, in the case of a semiconductor device 100 in the form of an IGBT, may be a collector contact. In this case, the second semiconductor area 106 is electrically connected to the second contact K2 via a backside emitter area having an opposite conductivity type to the second semiconductor area. In the case of a semiconductor device 100 in the form of an FET or JFET, the first contact K1 may be a drain contact. In the case of a semiconductor device 100 in the form of a diode or thyristor, the first contact K1 may be a cathode contact (anode contact). In the second semiconductor area 106, it is optionally possible for field stop zone(s) and buffer zone(s) to be formed.

In the working example of the semiconductor device 100 shown in the schematic cross-sectional view of FIG. 2, the first semiconductor area 104 has a vertical extent d in the vertical direction y of the SiC semiconductor body 102. In this working example, proceeding from the first surface 108, in a first depth region 114 of the SiC semiconductor body 102 from a depth $t=0$ to $t=d/2$, at least 60% or even at least 80% of the dopants of the first conductivity type correspond to the first dopant species. The dopants of the first conductivity type of the first dopant species may comprise boron, for example. In a second depth region 115 from $t=d/2$ to $t=d$, at least 30% or even at least 50% of the dopants of the first conductivity type correspond to the second dopant species. The dopants of the first conductivity type may contain, at a particular depth, one dopant species or two dopant species or even more dopant species, excluding impurities, e.g. Al and/or Ga. The first depth region 114 is, for example, an upper part of the first semiconductor area 104, and the second depth region 115 is, for example, a lower part of the first semiconductor area 104.

If the dopant dose of the first conductivity type, i.e. based on all dopant species of the first conductivity type, in the first depth region 114 of the first semiconductor area 104 is designated q1, and the doses of the first and second dopant species q11 and q12, the following applies to the first depth region 114:

$$q11/q1 > 0.6. \qquad (1)$$

If the dopant dose of the first conductivity type, i.e. based on all dopant species of the first conductivity type, of the first semiconductor area 104 in the second depth region 115 is designated q2 and the doses of the first and second dopant species q21 and q22, the following applies to the second depth region 115:

$$q22/q2 > 0.3. \qquad (2)$$

A dopant dose in the first depth region 114 is given by the dopant concentration integrated from $t=0$ to $t=d/2$ in the vertical direction in the first depth region 114, i.e. an amount of dopants based on a unit area, e.g. cm$^2$. A dopant dose in the second depth region 115 is given by the dopant concentration integrated from $t=d/2$ to $t=d$ in the vertical direction in the second depth region 115, i.e. an amount of dopants based on a unit area, e.g. cm$^2$. According to this working example, the average position of the second dopant species that serves for injection efficiency is closer to the pn junction 110 than the first dopant species that serves for electrical contacting of the first semiconductor area 104 with the first surface 108. In other words, the predominant proportion of the second dopant species is positioned closer to the pn junction 110 than the predominant proportion of the first dopant species, where "predominant" can mean at least 50%, especially at least 80%, of the amount of the respective dopant species. In general, the expression "average" in this application may relate to a predominant portion of the respective dopant species.

In one working example, a maximum dopant concentration of the first dopant species in the first depth region 114 is greater than a maximum dopant concentration of the second dopant species in the second depth region 115.

In a further working example, a maximum dopant concentration of the first dopant species in the first depth region 114 is less than a maximum dopant concentration of the second dopant species in the second depth region 115.

In the working example of the semiconductor device 100 shown in the schematic cross-sectional view of FIG. 3, an average dopant concentration of the first dopant species $\overline{c1}$ in a first part 118 of the first semiconductor area 104 adjoining the first surface 108 of the SiC semiconductor body 102 is greater than an average dopant concentration of the second dopant species $\overline{c2}$. In a second part 119 of the first semiconductor area 104 adjoining the second semiconductor area 106, the average dopant concentration of the second dopant species $\overline{c2}$ is greater than the average dopant concentration $\overline{c1}$ of the first dopant species. The average dopant concentration refers to an average value of the dopant concentration in the respective region determined in the vertical direction.

Thus, in the first part 118, i.e. in the depth region from t=0 to t=tref, where tref indicates a reference depth in which the first part 118 adjoins the second part 119 in the vertical direction y:

$$\overline{c1} > \overline{c2}. \quad (3)$$

It is likewise the case in the second part 119, i.e. in the depth region from t=tref to t=d, that:

$$\overline{c2} > \overline{c1}. \quad (4)$$

where c1 here identifies boron atoms, for example, and c2 aluminium atoms, for example.

In a narrower depth range than specified above, according to the implantation conditions, for example the implantation energies and annealing conditions used, the reverse behaviour may also exist in each case, provided that the above equations (3) and (4) are satisfied for this working example. It is likewise possible for c1(t)>c2(t) to be satisfied for every depth in the first part, whereas c2(t)>c1(t) may be satisfied for every depth in the second part.

As described in connection with the working example according to FIG. 2, it is also the case in the working example according to FIG. 3 that the second dopant species which serves for injection has an average position closer to the pn junction 110 than the first dopant species that serves for electrical contacting with the first surface 108. It is thus possible with this working example too to achieve the advantages elucidated in connection with the working example of FIG. 2.

For example, the reference depth tref is in a range between 50% to 80% of the vertical extent d of the first semiconductor area 104 into the SiC semiconductor body 102, i.e., in this working example:

$$0.5 \, d \leq tref \leq 0.8 \, d. \quad (5)$$

For example, the reference depth tref is in a range between 10% and 50% of the vertical extent d of the first semiconductor area 104 into the SiC semiconductor body 102, i.e., in this working example:

$$0.1 \, d \leq tref \leq 0.5 \, d. \quad (6)$$

In one working example, the first semiconductor area is p-doped and the second semiconductor area is n-doped. In a part of the n-doped drift zone adjoining the p-doped first semiconductor area, there may be partial compensation of the n-doping with boron. This leads to a reduction in charge carrier mobility owing to the additional scattering sites, for instance of boron, in the drift zone. The partial dopant compensation additionally lowers the net background charge. In this way, it is advantageously possible to achieve elevated breakdown resistance. Moreover, the additional boron doping in the drift zone can have an advantageous influence on the spread of harmful crystal defects.

Figure 4B:
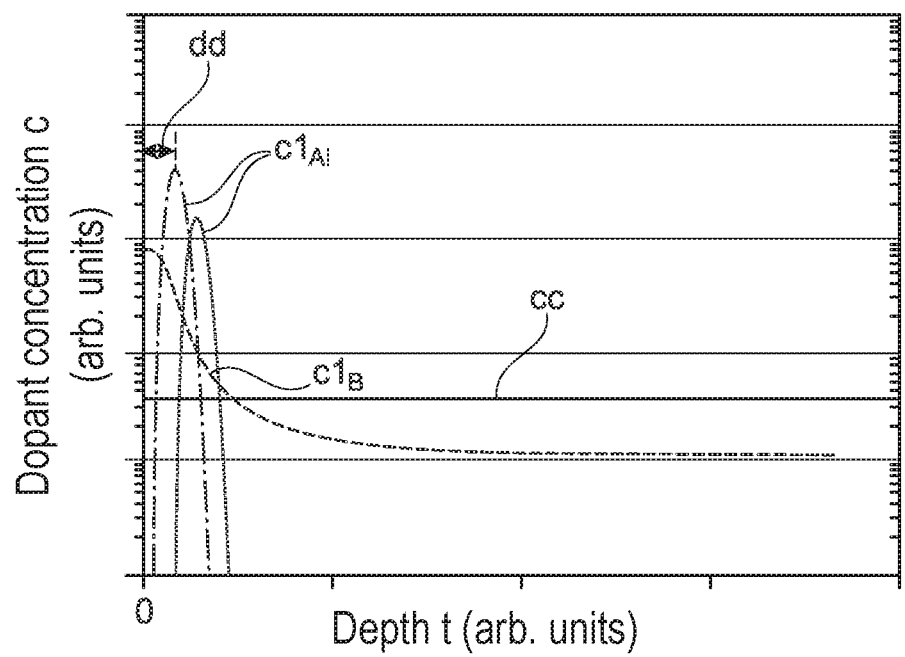

FIGS. 4A to 4B show profiles of dopant concentrations for formation of the first semiconductor area 104. The profiles of the implantations that form the first semiconductor area 104 are shown here over a vertical extent with increasing depth t.

In the diagram of FIG. 4A, the first semiconductor area 104 is formed by superposing a first profile of a B concentration $c1_B$ and a first profile of an Al concentration $c1_{Al}$ at a lower level compared to the first profile of a B concentration $c1_B$. The depth region in which the concentration $c1_B$ is greater than the concentration $c1_{Al}$ corresponds, for example, to the first part 118 in the working example in FIG. 3, and the depth region in which the concentration $c1_{Al}$ is greater than the concentration $c1_B$ corresponds, for example, to the second part 119 in the working example in FIG. 3. It will be appreciated that the first semiconductor area 104 may also be constructed from a superposition of multiple Al implantation profiles, the maxima of which are at a different depth (cf., for instance, FIG. 4B). It is likewise possible for the first semiconductor area 104 also to be constructed from a superposition of multiple B implantation profiles, the maxima of which are at different depths. A profile of a dopant concentration cc in the second semiconductor area 106 is shown in FIGS. 4A to 4B by way of example as a constant profile. It is optionally possible for one or even both of these sub-areas in the first semiconductor area 104 additionally to contain the dopant species gallium. A vertical separation dd between the first surface 108 and a closest peak of the Al implantation profile is, for example, within a range from 30 nm to 600 nm or within a range from 50 nm to 500 nm or within a range from 100 nm to 400 nm.

FIGS. 5A and 5B show a semiconductor device 500 having an SiC semiconductor body 100 with striped transistor cells TC and deep trench gate structures 150.

On a front side, the SiC semiconductor body 102 has the first surface 108 which may comprise coplanar surface sections which may form a ribbed first surface. The first surface 108 may coincide with a main lattice plane or run with an angle deviation α obliquely to a lattice plane, for example to the (0001) lattice plane, where the angle deviation may be at most 12°, for example about 4°.

In the embodiment described, the <0001>crystal direction is inclined by an angle deviation α relative to a normal N. The <11-20>crystal direction is inclined by the same angle deviation α relative to the horizontal plane. The <1-100>crystal direction is orthogonal to the cross-sectional plane.

On the reverse side, the SiC semiconductor body 102 has the second surface 112 parallel to the first surface 108.

A drift structure 130 formed in the SiC semiconductor body 102 comprises at least one highly doped contact layer 139 adjoining the second surface 112, and a lightly doped drift zone 131 of the second conductivity type between the first surface 108 and the highly doped contact layer 139. It is optionally possible for there also to be incorporated, between the drift zone 131 and the highly doped contact layer 139, a buffer layer having a dopant concentration which is higher on average than the dopant concentration within the drift zone 131 and lower than the dopant concentration within the contact layer 130 and also has the same conductivity type as these two zones.

The highly doped contact layer 139 is of the same conductivity type as the drift zone 131 and may be or include a substrate section sawn out of a crystal or divided from a crystal, or may have originated entirely or else partly from an epitaxial method. The contact layer 139 forms an ohmic contact with a second load electrode 320 that may directly adjoin the second surface 112. Along the second surface 102, the dopant concentration of the contact layer 139 is sufficiently high to form a low-resistance contact with the second load electrode 320.

The drift zone 131 may be formed in a layer grown onto the contact layer 139 by epitaxy. An average dopant concentration in the drift zone 131 is, for example, within a range from at least $10^{15}$ cm$^{-3}$ to at most $5\times10^{16}$ cm$^{-3}$. As well as the drift zone 131 and the contact layer 139, the drift structure 130 may have further doped areas, for example field stop zones, barrier zones and/or current spreading zones of the conductivity type of the drift zone 131 and/or insular, columnar and/or stripe-like areas of the complementary conductivity type.

Transistor cells TC on the front side of the SiC semiconductor body 102 are formed along gate structures 150 that extend from the first surface 108 into the SiC semiconductor body 102, with separation of adjacent gate structures 150 from one another by mesa sections 190 of the SiC semiconductor body 100.

A longitudinal extent of the gate structures 150 in a first horizontal direction x1 is greater than a width of the gate structures 150 in a second horizontal direction x2 orthogonal to the first horizontal direction and transverse to the longitudinal extent. The gate structures 150 may be long trenches that extend from one side of a cell field region having the transistor cells TC as far as an opposite side. The length of the gate structures 150 may be up to several hundreds of micrometres, or up to several millimetres or even up to several centimetres.

In other working examples, the gate structures 150 may be formed along parallel lines that each extend from one side of the cell field region to the opposite side, in which case a multitude of separate gate structures 150 are formed in each case along the same line. The gate structures 150 may also form a lattice with the mesa sections 190 in the meshes of the lattice.

The gate structures 150 may be homogeneously spaced apart from one another, may have the same width and/or may form a regular pattern. A middle-to-middle separation of the gate structures 150 may be within a range from at least 1 µm to at most 10 µm, for example from at least 2 µm to at most 5 µm. A vertical extent of the gate structures 150 may be at least 300 nm to at most 5 µm, for example within a range from at least 500 nm to at most 2 µm.

Side walls of the gate structures 150 may be aligned vertically relative to the first surface 108 or may be tilted slightly against the vertical direction, and mutually opposite side walls may run parallel or obliquely to one another. In one embodiment, the width of the gate structures 150 decreases with increasing distance from the first surface 108. For example, one side wall deviates from the normal N by the angle deviation α and the other side wall by −α.

The mesa sections 190 have two opposite mesa side walls 191, 192 that directly adjoin two adjacent gate structures 150. At least one first mesa side wall 191 lies in a lattice plane with high charge carrier mobility, for example in the case of 4H-SiC in a (11-20) lattice plane, called the A plane. The second mesa side wall 192 opposite the first mesa side wall 191 may be inclined relative to the lattice plane in question by twice the angle deviation a, for example by about 8°.

The gate structures 150 have a conductive gate electrode 155 that may have a highly doped polycrystalline silicon layer, a one-part or multipart metal structure or both. The silicon layer may be electrically connected to a gate metallization that forms or is electrically connected or coupled to a gate terminal.

Along at least one side of the gate structure 150, a gate dielectric 159 separates the gate electrode 155 from the SiC semiconductor body 102. The gate dielectric 159 may comprise a semiconductor dielectric, for example a thermally grown or deposited semiconductor oxide, e.g. silicon oxide, a semiconductor nitride, for example a deposited or thermally grown silicon nitride, a semiconductor oxide nitride, for example a silicon oxynitride, another deposited dielectric material or any combination of the materials mentioned. The layer thickness of the gate dielectric 159 may be chosen, for example, such that a threshold voltage of the transistor cells TC is within a range from 1 V to 8 V.

The gate structures 150 may have exclusively the gate electrode 155 and the gate dielectric 159 or may, in addition to the gate electrode 155 and the gate dielectric 159, have further conductive and dielectric structures, for example field plates and separation dielectrics.

In the mesa sections 190, source areas 111 are formed toward the front side of the SiC semiconductor body 102, which may directly adjoin the first surface 108 and the first mesa side wall 191 of the respective mesa section 190. In this case, each mesa section 190 may have a source area 111 with sections connected to one another in the SiC semiconductor body 102 or with at least two sections separated from one another in the SiC semiconductor body 102, which have low-ohm electrical connection to one another via a contact or trench contact adjoining the mesa section 190.

The mesa sections 190 further include doped areas 120 that separate the source areas 111 from the drift structure 130, and form first pn junctions pn1 with the drift structure 130 and second pn junctions pn2 with the source areas 111. The doped areas 120 form an ohmic contact with the first load electrode 310.

In the working example shown, a doped area 120 comprises a more lightly doped body area 121 and a more heavily doped shielding area 122.

The body area 121 directly adjoins the first mesa side wall 191. In the on state of the transistor cell TC, in the body area 121, an inversion channel that connects the source area 110 to the drift structure 130 is formed along the gate structure 150. A vertical extent of the body area 121 corresponds to a channel length of the transistor cells TC and may, for example, be 200 nm to 1500 nm.

The shielding areas 122, which ensure protection of a base of the gate structure 150 (called trench base) in the case of high field strengths in the blocking state, are formed between the body areas 121 and the second mesa side walls 192 and may directly adjoin the body areas 121. A vertical extent of the shielding areas 122 may be greater than a vertical extent of the body areas 121, for example greater than a vertical extent of the gate structures 150. A portion of a shielding area 122 may be formed directly between the base of the gate structure 150 and the second surface 112 and shield the gate structure 150 from the potential of the second load electrode 320. A maximum dopant concentration p12 in the shielding areas 122 along the second mesa side walls 192 is for example higher, for example at least twice or even five times higher, than a maximum dopant concentration p11 in the body areas 121 along the first mesa side walls 191.

The first load electrode 310 may form a source terminal S or be electrically connected or coupled to the source terminal S. The second load electrode 320 on the reverse side may form a drain terminal D or be electrically connected or coupled to the drain terminal D.

In one working example, the transistor cells TC are re-channel FET cells with p-doped body areas 121, n-doped source areas 110 and an n-doped drift zone 131. In another embodiment, the transistor cells TC are p-channel FET cells with n-doped body areas 121, p-doped source areas 110 and a p-doped drift zone 131.

A load current that flows through the SiC semiconductor body 102 in the on state of the semiconductor device 500 between the first and second load electrodes 310, 320 passes through the body areas 121 in inversion channels induced along the gate dielectric 159. The higher dopant concentration in the shielding areas 122 compared to the dopant concentration in the body areas 121, in operation within the absolute maximum ratings, suppresses the formation of inversion channels along the second mesa side walls 192 and especially offers protection of the base of the gate structure 150 in the case of high field strengths in the blocking state. Since this area serves specially to protect the base of the gate structure 150 in the blocking state, the doping of this area with dopants having low-lying energy levels is particularly advantageous. Since this area is to bring about only relatively low injection of free charge carriers, this is ensured in the on state in an excellent manner by the only relatively low activation of these dopants, but without having to accept losses in the protective effect for the base of the gate structure 150, since these atoms having low-lying energy levels are again nearly completely activated as soon as they lie within a space charge zone.

FIG. 6 shows a semiconductor device 500 with planar gate structures 150 on the front side of the SiC semiconductor body 102, wherein an individual gate structure 150 within a cell field region is assigned two transistor cells TC formed symmetrically with respect to the gate structure 150.

The gate structures 150 comprise a conductive gate electrode 155 and a gate dielectric 159 which is formed directly on the first surface 101 and separates the gate electrode 155 from the SiC semiconductor body 102. A doped area 120 that extends from the first surface 108 into the SiC semiconductor body 102 is in each case assigned two adjacent transistor cells TC of two adjacent gate structures 150. Source areas 110 of the two transistor cells TC extend from the first surface 108 into the doped area 120. The doped area 120 has a contact area 129 in which the dopant concentration is higher than the dopant concentration in a main area of the doped area 120 outside the contact area 129 which may adjoin the first surface 101 between the source areas 111. The main area of the doped area 120 forms the body area 121 of the transistor cell TC.

A drift structure 130 with a drift zone 131 and a contact layer 139 separates the transistor cells TC from a second surface 112 of the SiC semiconductor body 102, and the drift zone 131 may extend between adjacent body areas 121 and below the gate electrodes 155 to the first surface 108.

In the on state, the transistor cells TC form lateral inversion channels in channel regions of the body areas 121 along the gate dielectric 159, which connect the source areas 110 to the sections of the drift structure 130 that adjoin the first surface 108, i.e. the drift zone 131.

An interlayer dielectric 210 separates the gate electrode 155 from a first load electrode 310 on the front side of the SiC semiconductor body 102. Contacts 315 in openings of the interlayer dielectric 210 connect the first load electrode 310 to the contact areas 129 and the source areas 111.

Figure 7:
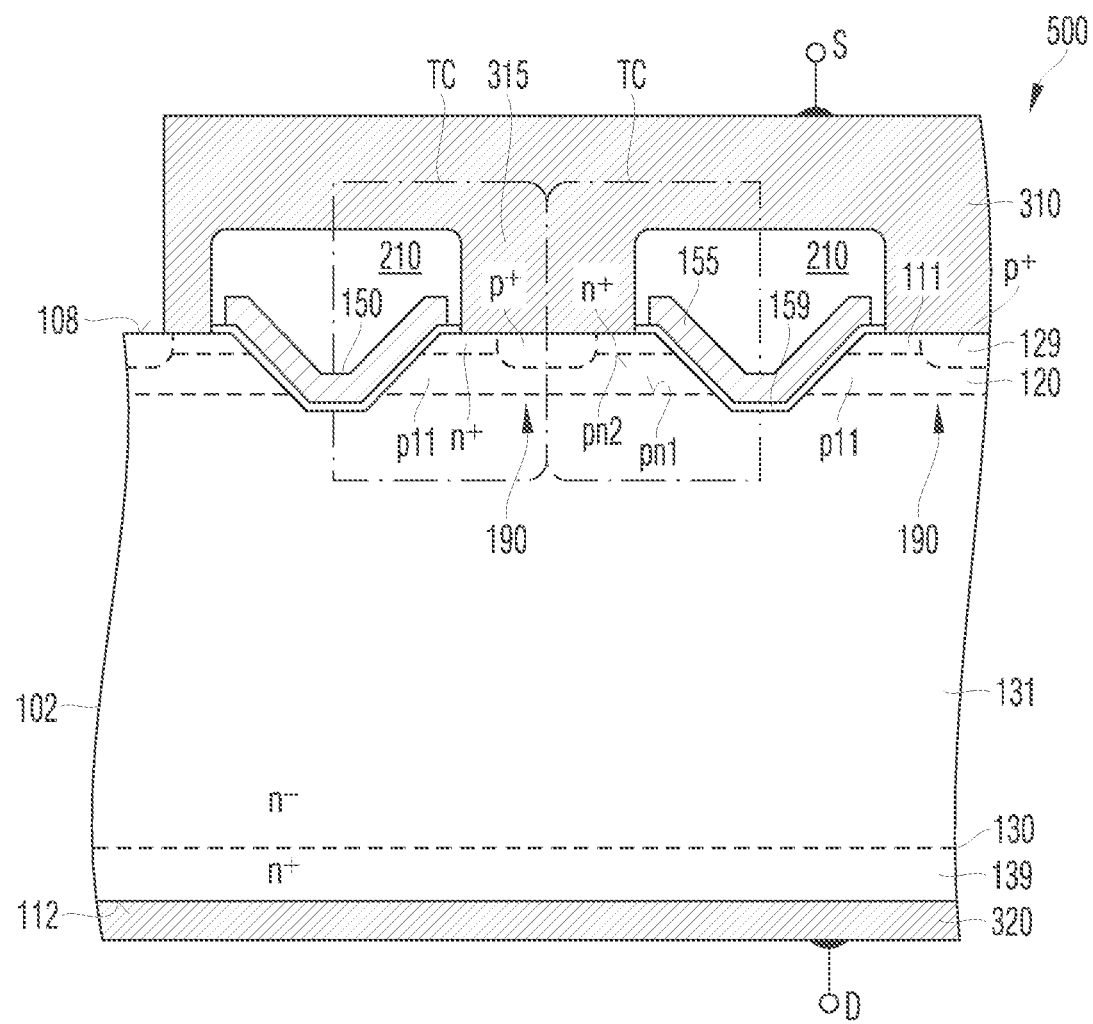
FIG. 7 is a schematic vertical cross section through a section of a semiconductor device according to one embodiment with flat trench gate structures.

In FIG. 7, the gate structures 150 are formed in flat trenches with a nearly V-shaped vertical cross-sectional area. The gate electrode 155 may extend in a nearly homogeneous layer thickness along the side walls and the base of the trenches. Mesa sections 190 of the SiC semiconductor body 102 between adjacent gate structures 150 comprise source areas 111 formed along the first surface 108 and doped areas 120 between the source areas 110 and the drift structure 130, and the doped areas 120 may each have a more lightly doped body area 121 and a more heavily doped contact area 129.

Figure 8:
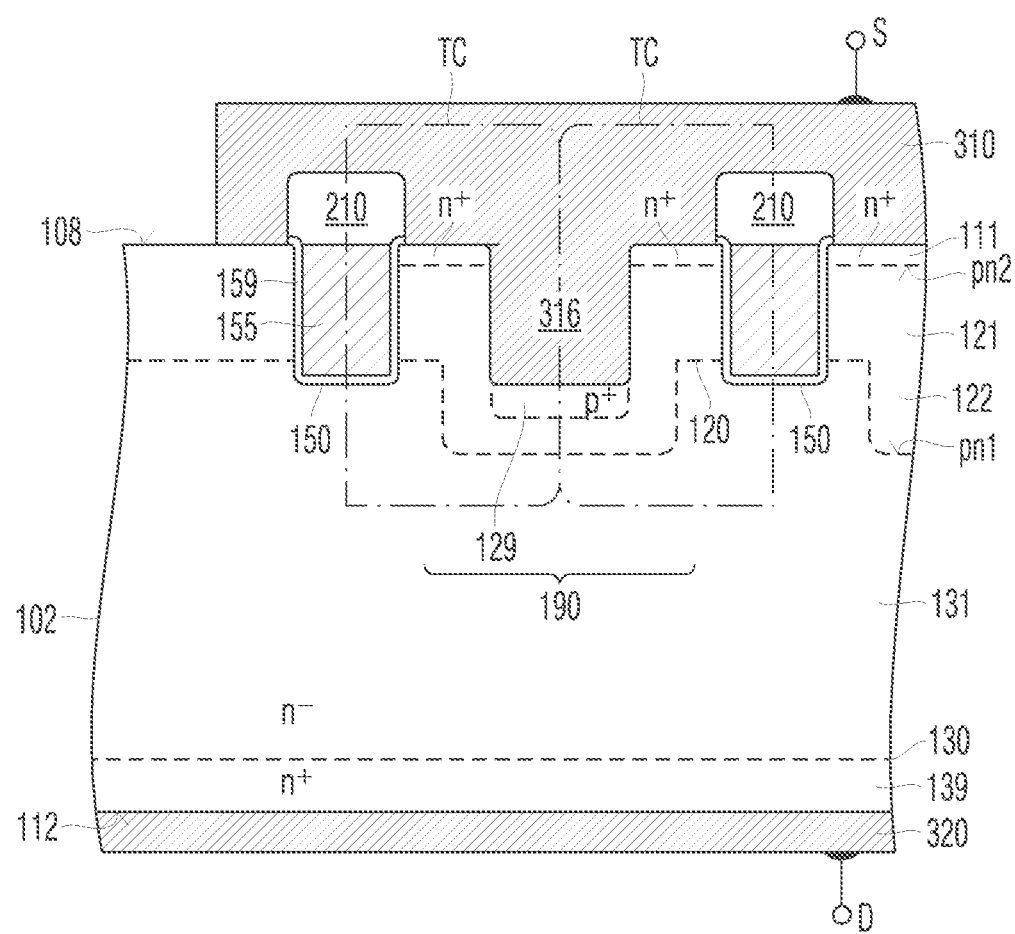
FIG. 8 is a schematic vertical cross section through a section of a semiconductor device according to a further embodiment with deep trench gate structures.

The semiconductor device 500 of FIG. 8 has gate structures 150 that extend from the first surface 108 into an SiC semiconductor body 102, where the side walls of the gate structures 150 run vertically to the first surface 108. In mesa sections 190 of the SiC semiconductor body 100 between adjacent gate structures 150, doped areas 120 are formed, which form first pn junctions pn1 with a drift structure 130 and second pn junctions pn2 with source areas 111 formed along the first surface 108.

An interlayer dielectric 210 separates a gate electrode 155 of the gate structures 150 from a first load electrode 310. Between adjacent gate structures 150, trench contacts 316 extend from the first load electrode 310 into the mesa sections 190, form lateral contacts with the SiC semiconductor body 102 and connect the source areas 111 to the first load electrode 310. A vertical extent of a section of the trench contact 316 in the SiC semiconductor body 102 may correspond roughly to the vertical extent of the gate structures 150.

A portion of the doped area 120 may in each case be formed beneath the trench contacts 316 and separate these from the drift structure 130. A more heavily doped contact area 129 of the doped area 120 may directly adjoin the trench contact 316.

The working examples shown in FIGS. 5A to 8 are illustrative FETs of the semiconductor devices 100 shown in FIGS. 1 to 4B, wherein the body areas 121 in FIGS. 5B, 6, 7, 8 may correspond to the first semiconductor area 104 described in connection with FIG. 1. The shielding area 122 in FIG. 5B may likewise correspond to the first semiconductor area 104 described in connection with FIG. 1. It is also possible for both the body area 121 and the shielding area 122 to be constructed in the same manner as the first semiconductor area 104 described in connection with FIG. 1. The drift zone 131 in FIGS. 5B, 6, 7, 8 may correspond, for example, to the second semiconductor area 106 described in connection with FIG. 1.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device, comprising:
   a silicon carbide (SiC) body having a first semiconductor area of a first conductivity type and a second semiconductor area of a second conductivity type,
   wherein the first semiconductor area is electrically contacted with a first surface of the SiC body and forms a pn junction with the second semiconductor area,
   wherein the first semiconductor area and the second semiconductor area are arranged one on top of the other in a vertical direction perpendicular to the first surface,
   wherein the first semiconductor area has a first dopant species and a second dopant species,
   wherein an average dopant concentration of the first dopant species in a first part of the first semiconductor area adjoining the first surface of the SiC body is greater than an average dopant concentration of the second dopant species in the first part,
   wherein an average dopant concentration of the second dopant species in a second part of the first semiconductor area adjoining the second semiconductor area is greater than an average dopant concentration of the first dopant species in the second part,
   wherein the average dopant concentration of the first dopant species and the average dopant concentration of the second dopant species are determined along a vertical extent of the first and second parts,
   wherein the first dopant species is B and the second dopant species is Al or Ga.

2. The semiconductor device of claim 1, wherein a flattest dopant energy level of the first dopant species has a greater energy gap from the closest band edge than a flattest dopant energy level of the second dopant species from the closest band edge.

3. The semiconductor device of claim 1, wherein a vertical profile of a dopant concentration of the second dopant species in the second part of the first semiconductor area has at least one peak.

4. The semiconductor device of claim 3, wherein a vertical distance between the first surface and the one peak is within a range from 30 nm to 600 nm.

5. The semiconductor device of claim 1, wherein the vertical profile of the dopant concentration of the second dopant species in the second part of the first semiconductor area has a plurality of peaks, and wherein a dopant concentration at the plurality of peaks decreases with increasing distance from the first surface of the SiC body.

6. The semiconductor device of claim 5, wherein a vertical distance between the first surface and a closest peak of the plurality of peaks is within a range from 30 nm to 600 nm.

7. The semiconductor device of claim 1, wherein a maximum dopant concentration of the first dopant species in the first part of the first semiconductor area is less than a maximum dopant concentration of the second dopant species in the second part of the first semiconductor area.

8. The semiconductor device of claim 1, wherein a vertical profile of a dopant concentration of the first dopant species reaches deeper into the SiC body than a vertical profile of a dopant concentration of the second dopant species.

9. The semiconductor device of claim 1, wherein a vertical profile of a dopant concentration of the second dopant species has a separation from the first surface of the SiC body.

10. The semiconductor device of claim 1, wherein the first semiconductor area further comprises a third dopant species of the first conductivity type, and wherein the third dopant species is a species other than Al and Ga.

11. The semiconductor device of claim 1, wherein the first part merges into the second part at a depth proceeding from the first surface, and wherein the depth is within a range between 10% and 85% of a vertical penetration depth of the first semiconductor area into the SiC body.

12. The semiconductor device of claim 1, wherein the second semiconductor area is a drift zone.

13. The semiconductor device of claim 12, wherein the drift zone has a first region and a second region having lower doping compared to the first region, and wherein the first region of the drift zone is disposed between the first semiconductor area and the second region of the drift zone.

14. The semiconductor device of claim 1, further comprising:
   a first load terminal on the first surface of the SiC body; and
   a second load terminal on a second surface of the SiC body,
   wherein the semiconductor device is configured to conduct a load current of at least 1 A.

15. The semiconductor device of claim 1, wherein the semiconductor device is an insulated gate field effect transistor, and wherein the first semiconductor area is a body area adjoining a gate dielectric.

16. The semiconductor device of claim 1, wherein the semiconductor device is an insulated gate field effect transistor, and wherein the first semiconductor area reaches deeper into the SiC body than a body area that adjoins a gate dielectric.

17. The semiconductor device of claim 16, wherein the gate dielectric of the insulated gate field effect transistor is formed in a gate trench, wherein the body area adjoins a first side wall of the gate trench, wherein the first side wall is opposite a second side wall of the gate trench, and wherein the first semiconductor area adjoins the second side wall of the gate trench.

18. The semiconductor device of claim 1, wherein the semiconductor device is a power semiconductor diode, and wherein the first semiconductor area is an anode area.

19. A method for producing a semiconductor device, the method comprising:
   providing a silicon carbide (SiC) body; and
   forming a first semiconductor area of a first conductivity type and a second semiconductor area of a second conductivity type in the SiC body,
   wherein the first semiconductor area is electrically contacted with a first surface of the SiC body and forms a pn junction with the second semiconductor area,
   wherein the first semiconductor area and the second semiconductor area are arranged one on top of the other in a vertical direction perpendicular to the first surface,
   wherein the first semiconductor area has a first dopant species and a second dopant species,
   wherein an average dopant concentration of the first dopant species in a first part of the first semiconductor area adjoining the first surface of the SiC body is greater than an average dopant concentration of the second dopant species in the first part, wherein an average dopant concentration of the second dopant species in a second part of the first semiconductor area adjoining the second semiconductor area is greater than an average dopant concentration of the first dopant species in the second part, wherein the average dopant concentration of the first dopant species and the average dopant concentration of the second dopant species are determined along a vertical extent of the first and second parts.

20. The method of claim 19, wherein forming the first semiconductor area comprises ion implantation of boron within a dose range from $2 \times 10^{13}$ $cm^{-2}$ to $5 \times 10^{14}$ $cm^{-2}$.

21. The method of claim 19, wherein forming the first semiconductor area comprises at least one ion implantation of Al.

22. The method of claim 21, wherein forming the first semiconductor area comprises multiple ion implantations of Al at different ion implantation energies.

* * * * *